(12) United States Patent
Si et al.

(10) Patent No.: US 10,312,117 B2
(45) Date of Patent: Jun. 4, 2019

(54) APPARATUS AND RADIANT HEATING PLATE FOR PROCESSING WAFER-SHAPED ARTICLES

(71) Applicant: LAM RESEARCH AG, Villach (AT)

(72) Inventors: Hongbo Si, San Jose, CA (US); Bridget Hill, Villach (AT); Butch Berney, Pleasanton, CA (US); Daniel Brien, Villach (AT)

(73) Assignee: LAM RESEARCH AG, Villach (AT)

( * ) Notice: Subject to any disclaimer, the term of this patent is extended or adjusted under 35 U.S.C. 154(b) by 274 days.

(21) Appl. No.: 15/233,698

(22) Filed: Aug. 10, 2016

(65) Prior Publication Data
US 2018/0047596 A1    Feb. 15, 2018

(51) Int. Cl.
| | | |
|---|---|---|
| *H05B 3/68* | (2006.01) | |
| *F26B 3/30* | (2006.01) | |
| *H01L 21/67* | (2006.01) | |
| *H05B 3/00* | (2006.01) | |
| *H01L 21/687* | (2006.01) | |

(52) U.S. Cl.
CPC .. *H01L 21/67115* (2013.01); *H01L 21/67034* (2013.01); *H01L 21/67051* (2013.01); *H01L 21/68728* (2013.01); *H01L 21/68792* (2013.01); *H05B 3/0047* (2013.01)

(58) Field of Classification Search
CPC ......... H01L 21/67034; H01L 21/67051; H01L 21/67115; H01L 21/68728; H01L 21/68792; H05B 3/0047

USPC .............. 219/443.1–468.2; 118/724–730; 392/418–420
See application file for complete search history.

(56) References Cited

U.S. PATENT DOCUMENTS

| | | | |
|---|---|---|---|
| 4,903,717 A | 2/1990 | Sumnitsch | |
| 5,513,668 A | 5/1996 | Sumnitsch | |
| 6,038,064 A * | 3/2000 | Kanao | G02B 21/16 359/355 |
| 6,485,531 B1 | 11/2002 | Schob | |
| 9,245,777 B2 | 1/2016 | Plazonic et al. | |
| 2013/0284095 A1* | 10/2013 | Ranish | H01L 21/02104 118/725 |
| 2014/0263268 A1* | 9/2014 | Cong | H05B 1/0227 219/392 |
| 2014/0339215 A1* | 11/2014 | Plazonic | H01L 21/67115 219/389 |
| 2015/0204491 A1* | 7/2015 | Yuan | F21V 5/045 362/311.02 |

FOREIGN PATENT DOCUMENTS

WO    2007/101764 A1    9/2007

* cited by examiner

*Primary Examiner* — Sang Y Paik

(57) ABSTRACT

An apparatus for processing wafer-shaped articles includes a rotary chuck adapted to hold a wafer-shaped article of a predetermined diameter thereon. A radiant heating plate faces a wafer-shaped article when positioned on the rotary chuck. The radiant heating plate includes radiant heating elements, but a central region of the radiant heating plate is free of radiant heating elements. The radiant heating plate further includes at least one refraction element that refracts radiation emitted by the radiant heating elements and passed through the at least one refraction element, toward the central region of the radiant heating plate.

20 Claims, 3 Drawing Sheets

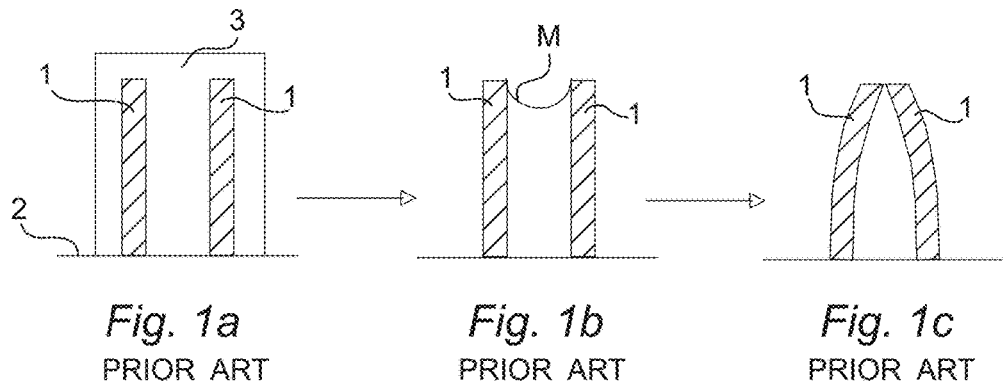
Fig. 1a PRIOR ART
Fig. 1b PRIOR ART
Fig. 1c PRIOR ART
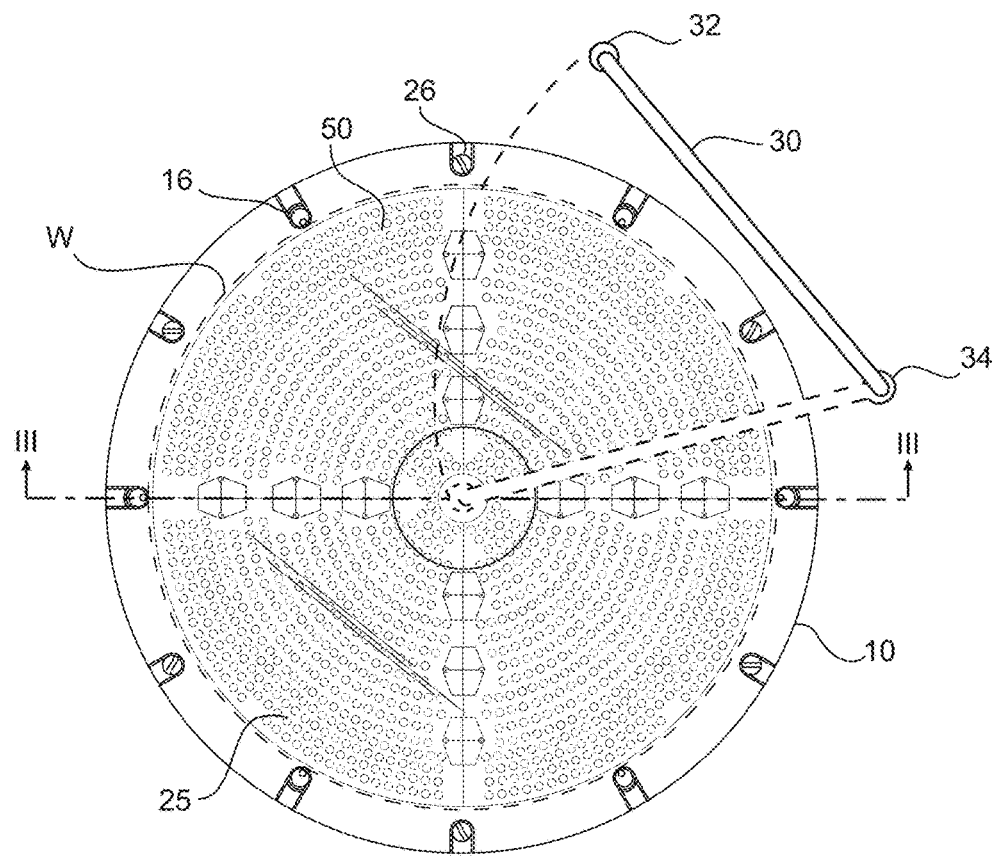
Fig. 2

APPARATUS AND RADIANT HEATING PLATE FOR PROCESSING WAFER-SHAPED ARTICLES

BACKGROUND OF THE INVENTION

1. Field of the Invention

The invention relates generally to an apparatus and radiant heating plate for processing wafer-shaped articles, such as semiconductor wafers.

2. Description of Related Art

Semiconductor wafers are subjected to various surface treatment processes such as etching, cleaning, polishing and material deposition. To accommodate such processes, a single wafer may be supported in relation to one or more treatment fluid nozzles by a chuck associated with a rotatable carrier, as is described for example in U.S. Pat. Nos. 4,903,717 and 5,513,668.

Alternatively, a chuck in the form of a ring rotor adapted to support a wafer may be located within a closed process chamber and driven without physical contact through an active magnetic bearing, as is described for example in International Publication No. WO 2007/101764 and U.S. Pat. No. 6,485,531.

As the device features formed on such wafers continues to decrease in their layout dimensions, with an attendant increase in the aspect ratio of those device features, and as the diameter of such wafers continues to increase, the phenomenon of pattern collapse during drying of the wafers becomes increasingly problematic. Existing techniques for preventing pattern collapse are of limited effectiveness, in part because of a limited ability of conventional processing equipment to heat the wafer precisely and with an optimum temperature profile.

SUMMARY OF THE INVENTION

Thus, in one aspect, the present invention relates to an apparatus for processing wafer-shaped articles, comprising a rotary chuck adapted to hold a wafer-shaped article of a predetermined diameter thereon. A radiant heating plate faces a wafer-shaped article when positioned on the rotary chuck. The radiant heating plate comprises radiant heating elements, but a central region of the radiant heating plate is free of radiant heating elements. The radiant heating plate further comprises at least one refraction element that refracts radiation emitted by the radiant heating elements and passed through the at least one refraction element, toward the central region of the radiant heating plate.

In preferred embodiments of the apparatus according to the present invention, the at least one refraction element is at least one lens.

In preferred embodiments of the apparatus according to the present invention, the rotary chuck is mounted for rotation about a stationary central post, and the radiant heating plate is secured to an upper end of the stationary central post.

In preferred embodiments of the apparatus according to the present invention, the radiant heating plate comprises a cover plate that is substantially transparent to radiation emitted by the radiant heating elements.

In preferred embodiments of the apparatus according to the present invention, the cover plate comprises a central opening overlying the central region, and the at least one refraction element is comprised by a cap configured to cover the opening and to overlie the radiant heating elements that are adjacent to the central region.

In preferred embodiments of the apparatus according to the present invention, a periphery of the cap overlies the radiant heating elements that are adjacent to the central region, the periphery comprising surfaces that converge in a direction away from a center of the central opening.

In preferred embodiments of the apparatus according to the present invention, the rotary chuck is mounted for rotation about a stationary central post, and the radiant heating plate and the cap are secured to an upper end of the stationary central post.

In preferred embodiments of the apparatus according to the present invention, the cover plate is made from quartz or sapphire.

In preferred embodiments of the apparatus according to the present invention, the cap is made from quartz or sapphire.

In preferred embodiments of the apparatus according to the present invention, the at least one lens comprises a molded silicone Fresnel lens positioned on the radiant heating elements that are adjacent the central region.

In preferred embodiments of the apparatus according to the present invention, the radiant heating elements are LEDs, and each of the LEDs that are adjacent the central region comprises a silicone lens positioned above a power die of the LEDs.

In preferred embodiments of the apparatus according to the present invention, a plate that is transparent to radiation emitted by the radiant heating elements is mounted for rotation with the spin chuck and being positioned between the radiant heating plate and a wafer-shaped article when positioned on the rotary chuck.

In another aspect, the present invention relates to a radiant heating plate comprising radiant heating elements, wherein a central region of the radiant heating plate is free of radiant heating elements. The radiant heating plate further comprises at least one refraction element that refracts radiation emitted by the radiant heating elements and passed through the at least one refraction element toward the central region of the radiant heating plate.

In preferred embodiments of the radiant heating plate according to the present invention, the at least one refraction element is at least one lens.

In preferred embodiments of the radiant heating plate according to the present invention, the radiant heating plate comprises a cover plate that is substantially transparent to radiation emitted by the radiant heating elements.

In preferred embodiments of the radiant heating plate according to the present invention, the cover plate comprises a central opening overlying the central region, and the at least one refraction element is comprised by a cap configured to cover the opening and to overlie the radiant heating elements that are adjacent to the central region.

In preferred embodiments of the radiant heating plate according to the present invention, a periphery of the cap overlies the radiant heating elements that are adjacent to the central region, the periphery comprising surfaces that converge in a direction away from a center of the central opening.

In preferred embodiments of the radiant heating plate according to the present invention, the cover plate is made from quartz or sapphire.

In preferred embodiments of the radiant heating plate according to the present invention, the cap is made from quartz or sapphire.

In preferred embodiments of the radiant heating plate according to the present invention, the at least one lens comprises a molded silicone Fresnel lens positioned on the radiant heating elements that are adjacent the central region.

In preferred embodiments of the radiant heating plate according to the present invention, the radiant heating elements are LEDs, and each of the LEDs that are adjacent the central region comprises a silicone lens positioned above a power die of the LEDs.

BRIEF DESCRIPTION OF THE DRAWINGS

Other objects, features and advantages of the invention will become more apparent after reading the following detailed description of preferred embodiments of the invention, given with reference to the accompanying drawings, in which:

FIGS. 1a, 1b and 1c are an explanatory illustration of the phenomenon of pattern collapse;

FIG. 2 is a plan view of an apparatus according to a first embodiment of the present invention;

DETAILED DESCRIPTION OF PREFERRED EMBODIMENTS

Figure 3:
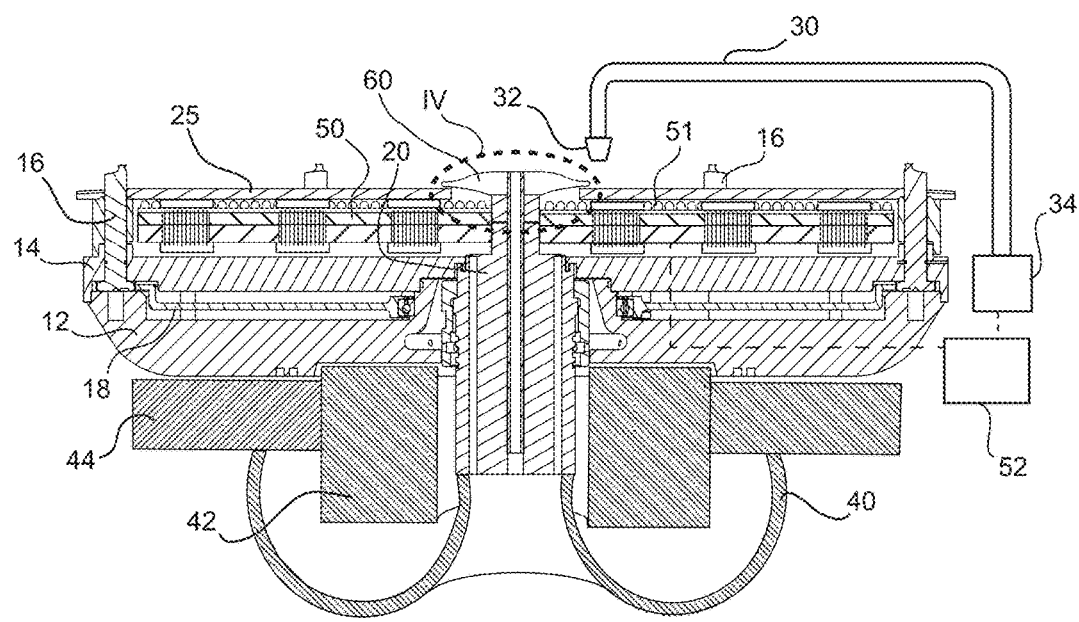
FIG. 3 is a sectional view along the line III-III in FIG. 2.

Referring now to FIG. 1, device features 1 formed on a semiconductor wafer 2 may be fins of doped silicon or any other structures or materials formed or used in the fabrication of semiconductor devices. During processing, the wafer 2 is rinsed, typically first with water and then with isopropyl alcohol IPA, which is shown at 3 in FIG. 1a surrounding the fins 1. As the wafer is dried, the IPA 3 evaporates; however, owing to surface tension and the high aspect ratio of the fins 1, the IPA 3 is driven off more slowly from the space between the fins, which results in the formation of a meniscus shown at M in FIG. 1b. As drying of the wafer continues, the surface tension of the IPA 3 pulls the fins 1 toward each other as shown in FIG. 1c, which can impair or prevent the correct performance of the associated semiconductor device.

FIG. 2 shows a first embodiment of an apparatus according to the present invention, in which a spin chuck 10 is designed to hold and rotate a wafer W of a predetermined diameter, for example 300 mm or 450 mm. Wafer W is held by a circular series of gripping pins 16, which in this embodiment are six in number. Pins 16 pass through openings in a transparent plate 25 made of quartz or sapphire. Plate 25 is secured to chuck 10 by screws 26 and rotates with the chuck 10. When a wafer W is positioned on the chuck, it is held above the plate 25 so that the lower surface of the wafer is parallel to the plate 25 and spaced therefrom by a small gap.

Beneath the transparent plate 25 is mounted a radiant heating plate 50, which will be described in greater detail below.

Adjacent the chuck 10 a boom swing arm 30 is mounted for pivotal motion about its drive motor 34. Arm 30 is supplied with process and/or rinse liquid, which is discharges downwardly through its discharge nozzle 32. Boom swing arm 30 is movable between a standby position shown in solid line in FIG. 2, and a central position shown in broken line. Discharge nozzle 32 can therefore scan across the full radius of a wafer W, and when a wafer W is rotated by chuck 10, thereby dispense liquid onto its entire upwardly-facing surface.

Turning now to FIG. 3, it can be seen that the rotary chuck 10 is made up of a lower chuck body 12 and an upper chuck body 14, which are secured to one another and are journalled for rotation about a stationary central post 20. The pins 16 and transparent plate 25 also rotate with the chuck 10 in this embodiment, as does the ring gear 18 which is in continuous meshing engagement with each of the gripping pins 16 via gear teeth provided at the bases of these latter. Ring gear 18 can also rotate relative to the chuck 10 to a limit extent, thereby to rotate pins 16 about their respective axes and move the uppermost eccentric gripping portions between their open and closed positions, in a manner well known per se.

The stationary post 20 is mounted on a machine frame 40 of the apparatus, as is a stator 44, whereas rotor 42 is secured to the lower chuck body 12, with the stator 44 and rotor 42 constituting a magnetic motor that drives the chuck 10 in rotation. Further particulars of the overall chuck structure are described for example in commonly-owned U.S. Pat. No. 9,245,777.

Radiant heating plate 50 in this embodiment is mounted on the stationary post 20, and therefore does not rotate, whereas it is enveloped by the rotating structure of the chuck comprising elements 25, 14, 16. Radiant heating plate 50 in this embodiment comprises a multiplicity of blue LEDs 51 mounted facing the transparent plate 25, and an on-board controller 52 mounted on the underside of heating assembly 50. Controller 50 controls the turning on and off, as well as the power, of the blue LEDs 51, and also communicates wirelessly with the motor 34 of the boom swing arm 30.

As the radiant heating plate 50 is secured to the central post, there is a central region of the plate that does not have heating elements such as the blue LEDs 51. The lack of heating elements in a central region is a characteristic of various types of radiant heating plates. The present inventors have discovered that the lack of heating elements in the central region causes a lower temperature in the center of the wafer than had been expected, and, furthermore, that this lower temperature cannot be corrected without overheating the wafer in other areas.

The apparatus of this embodiment is therefore equipped with a radiant heating plate in which a central opening in the transparent plate 25 is covered with a refractive element 60, which in this embodiment is rigidly secured to the upper end of the stationary post.

Figure 4:
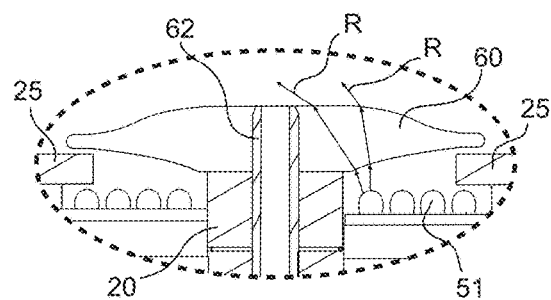
FIG. 4 is an enlarged view of the detail IV in FIG. 3.

As shown in FIG. 4, the refraction element 60 refracts radiation R emitted by the radiant heating elements 51 and passed through the refraction element 60 toward the central region of said radiant heating plate. The refraction element 60 is in this embodiment a lens made from quartz or sapphire that covers a central opening in cover plate 25. Lens 60 has axial symmetry about the axis of rotation of the spin chuck. The periphery of lens 60 overlies the innermost blue LEDs 51, so that radiation from these blue LEDs 51 is directed more toward the center of a wafer W supported by the chuck than would be the case in the absence of lens 60.

The stationary post 20 and the lens cap 60 may also include one or more conduits 62, to supply the underside of a wafer W with gas or liquid.

The blue LED lamps 51 have a maximum intensity at a wavelength of about 450 nm. Other sources of radiation could be used, but it is preferred to use sources emitting radiation having a maximum intensity in a wavelength range from 390 nm to 550 nm and more preferably in a wavelength range from 400 nm to 500 nm.

Whereas radiation of that wavelength characteristic is largely transmitted by the plate 25, that same radiation is largely absorbed by the semiconductor material of the wafer W, especially when the wafer W is silicon.

This arrangement allows very fast local heating of the wafer W, in a manner that causes evaporation of rinse liquid before the damaging meniscus has a chance to form. For example, each LED 51 may have a power consumption of 10 W and provides a light power of 3 W, which light power can be generated nearly instantaneously. Additionally, lesser light powers can be generated for selected LEDs 51 when desired, for examples by pulsing the power supply to selected LEDs 51 at for example 500 Hz, in a manner known per se.

Figure 5:
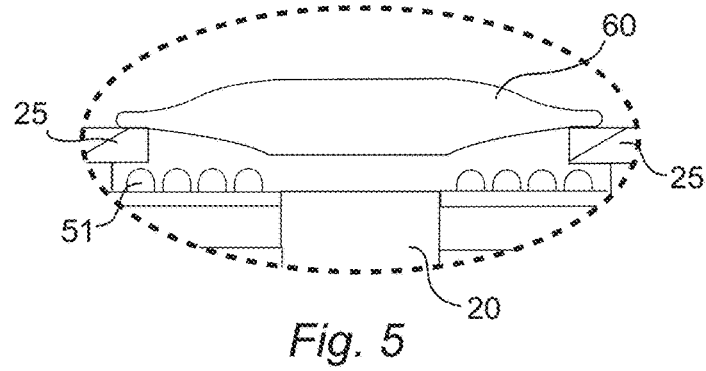
FIG. 5 is a view similar to FIG. 4, of a second embodiment of the present invention.

In the embodiment of FIG. 5, the lens cap 60 is rigidly secured to the cover plate 25, and therefore rotates in unison with the cover plate 25 and the spin chuck. The lens cap 60 otherwise functions in the same manner as the preceding embodiment, as regards bending radiation emitted by blue LEDs 51 more toward the center of the heating plate 50 and a wafer W supported by the chuck.

Figure 6:
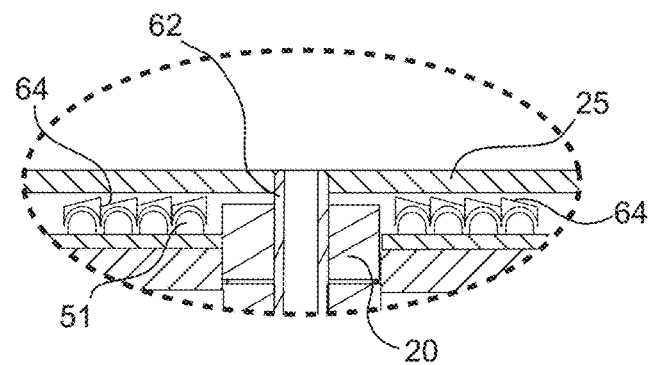
FIG. 6 is a view similar to FIG. 4, of a third embodiment of the present invention.

In the embodiment of FIG. 6, the refraction element takes the form of one or more molded silicone Fresnel lenses 64 positioned on the innermost blue LEDs 51, i.e., those adjacent the central region. The Fresnel lenses 64 serve to refract radiation emitted from the blue LEDs similarly to the preceding embodiments.

Figure 7:
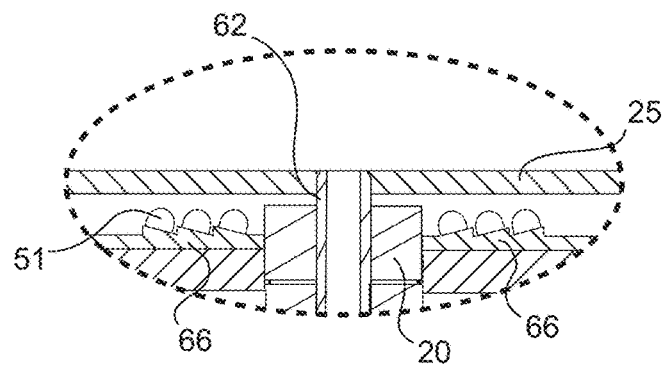
FIG. 7 is a view similar to FIG. 4, of a fourth embodiment of the present invention.

In the embodiment of FIG. 7, the innermost blue LEDs 51 are mounted in a tilted manner, for example by fashioning inclined mounting surfaces on an underlying printed circuit board 66, so that the primary axes of emission of the innermost blue LEDs 51 surrounding the central region converge toward that central region. This embodiment therefore does not rely on a refraction element to direct the radiation toward the center of the radiant heating plate.

It will be appreciated that the control of the power supplied to the various concentric zones of the heating assembly corresponds to the radial position of the discharge nozzle 32 of the rinse fluid, and thus controller 52 controls the power supply to the LEDs 51 of the relevant zones based on the radial position of the discharge nozzle.

While the present invention has been described in connection with various preferred embodiments thereof, it is to be understood that those embodiments are provided merely to illustrate the invention, and that the invention is not limited to those embodiments, but rather includes that which is encompassed by the true scope and spirit of the appended claims.

What is claimed is:

1. An apparatus for processing wafer-shaped articles, comprising:
    a rotary chuck adapted to hold a wafer-shaped article of a predetermined diameter thereon;
    a radiant heating plate that faces a wafer-shaped article when positioned on said rotary chuck, said radiant heating plate comprising radiant heating elements, wherein a central region of said radiant heating plate is free of radiant heating elements, said radiant heating plate further comprising at least one refraction element that refracts radiation emitted by said radiant heating elements and passed through said at least one refraction element toward said central region of said radiant heating plate; and
    a cover plate arranged above the radiant heating plate, wherein said cover plate includes a central opening overlying said central region, and wherein said at least one refraction element is arranged to cover said central opening above said central region that is free of said radiant heating elements.

2. The apparatus according to claim 1, wherein the at least one refraction element is at least one lens.

3. The apparatus according to claim 1, wherein said rotary chuck is mounted for rotation about a stationary central post, and wherein said radiant heating plate is secured to an upper end of said stationary central post.

4. The apparatus according to claim 1, wherein said cover plate that is substantially transparent to radiation emitted by said radiant heating elements.

5. The apparatus according to claim 4, wherein said at least one refraction element is comprised by a cap configured to cover said central opening and to overlie said radiant heating elements that are adjacent to said central region.

6. The apparatus according to claim 5, wherein a periphery of said cap overlies said radiant heating elements that are adjacent to said central region, said periphery comprising surfaces that converge in a direction away from a center of said central opening.

7. The apparatus according to claim 5, wherein said rotary chuck is mounted for rotation about a stationary central post, and wherein said radiant heating plate and said cap are secured to an upper end of said stationary central post.

8. The apparatus according to claim 4, wherein said cover plate is made from quartz or sapphire.

9. The apparatus according to claim 5, wherein said cap is made from quartz or sapphire.

10. The apparatus according to claim 2, wherein said at least one lens comprises a molded silicone Fresnel lens positioned on said radiant heating elements that are adjacent said central region.

11. The apparatus according to claim 1, wherein said radiant heating elements are LEDs, and wherein each of said LEDs that are adjacent said central region comprises a silicone lens positioned above a power die of said LEDs.

12. A radiant heating plate, comprising:
    radiant heating elements, wherein a central region of said radiant heating plate is free of radiant heating elements, said radiant heating plate further comprising at least one refraction element that refracts radiation emitted by said radiant heating elements and passed through said at least one refraction element toward said central region of said radiant heating plate; and
    a cover plate arranged above the radiant heating elements, wherein said cover plate includes a central opening overlying said central region, and wherein said at least one refraction element is arranged to cover said central opening above said central region that is free of said radiant heating elements.

13. The radiant heating plate according to claim 12, wherein the at least one refraction element is at least one lens.

14. The radiant heating plate according to claim 12, wherein said cover plate is substantially transparent to radiation emitted by said radiant heating elements.

15. The radiant heating plate according to claim 14, wherein said at least one refraction element is comprised by a cap configured to cover said central opening and to overlie said radiant heating elements that are adjacent to said central region.

16. The radiant heating plate according to claim 15, wherein a periphery of said cap overlies said radiant heating elements that are adjacent to said central region, said periphery comprising surfaces that converge in a direction away from a center of said central opening.

17. The radiant heating plate according to claim 14, wherein said cover plate is made from quartz or sapphire.

18. The radiant heating plate according to claim 15, wherein said cap is made from quartz or sapphire.

19. The radiant heating plate according to claim 13, wherein said at least one lens comprises a molded silicone Fresnel lens positioned on said radiant heating elements that are adjacent said central region.

20. The radiant heating plate according to claim 12, wherein said radiant heating elements are LEDs, and wherein each of said LEDs that are adjacent said central region comprises a silicone lens positioned above a power die of said LEDs.

* * * * *